(12) United States Patent
Neuwirth et al.

(10) Patent No.: US 11,850,630 B2
(45) Date of Patent: Dec. 26, 2023

(54) DEVICE AND METHOD FOR PRODUCING ACTIVE HAPTIC FEEDBACK

(71) Applicant: TDK Electronics AG, Munich (DE)

(72) Inventors: Daniel Neuwirth, Vilshofen (DE); Roman Puchleitner, St. Stefan (AT); Aditya Rajapurkar, Graz (AT); Andreas Pentscher-Stani, Leibnitz (AT)

(73) Assignee: TDK Electronics AG, Munich (DE)

( * ) Notice: Subject to any disclaimer, the term of this patent is extended or adjusted under 35 U.S.C. 154(b) by 815 days.

(21) Appl. No.: 16/967,068

(22) PCT Filed: Feb. 5, 2019

(86) PCT No.: PCT/EP2019/052786
§ 371 (c)(1),
(2) Date: Aug. 3, 2020

(87) PCT Pub. No.: WO2019/154810
PCT Pub. Date: Aug. 15, 2019

(65) Prior Publication Data
US 2021/0031235 A1 Feb. 4, 2021

(30) Foreign Application Priority Data
Feb. 6, 2018 (DE) .......................... 102018102630.7

(51) Int. Cl.
*B06B 1/06* (2006.01)
*G06F 3/01* (2006.01)
(Continued)

(52) U.S. Cl.
CPC ............ *B06B 1/0644* (2013.01); *G06F 3/016* (2013.01); *H02N 2/043* (2013.01); *H03K 17/964* (2013.01);
(Continued)

(58) Field of Classification Search
CPC ..... B06B 1/0644; G06F 3/016; G06F 3/0202; H10N 30/202; H10N 30/50; H03K 17/964;
(Continued)

(56) References Cited

U.S. PATENT DOCUMENTS 9,590,624 B2 3/2017 Ujii et al.
9,641,173 B2 5/2017 Aono
(Continued)

FOREIGN PATENT DOCUMENTS

CA 2996919 A1 4/2017
CN 102473052 A 5/2012
(Continued)

*Primary Examiner* — Emily P Pham
(74) *Attorney, Agent, or Firm* — Slater Matsil, LLP

(57) ABSTRACT

A device and a method for producing haptic feedback are disclosed. In an embodiment a device includes at least one piezoelectric actuator having a plurality of piezoelectric layers and internal electrodes arranged therebetween, a first amplification element and a second amplification element, wherein the piezoelectric actuator is arranged between the amplification elements, wherein the piezoelectric actuator is configured to change its extension in a first direction upon application of an electrical voltage, and wherein the amplification elements are configured to deform as a result of the change in the extension of the piezoelectric actuator such that a subregion of a respective amplification element is moved relative to the piezoelectric actuator in a second direction, which is perpendicular to the first direction and a driver circuit configured to apply the electrical voltage to the piezoelectric actuator such that the amplification elements are deformed thereby producing the haptic feedback against an object pressing on the device, the haptic feedback imitating a jump in force.

20 Claims, 4 Drawing Sheets

(51) Int. Cl.
*H02N 2/04* (2006.01)
*H03K 17/96* (2006.01)
*H10N 30/50* (2023.01)
*H10N 30/20* (2023.01)

(52) U.S. Cl.
CPC ....... *H03K 17/9625* (2013.01); *H10N 30/202* (2023.02); *H10N 30/50* (2023.02); *H03K 2217/96062* (2013.01)

(58) Field of Classification Search
CPC ..... H03K 17/9625; H03K 2217/96027; H03K 2217/96062; H02N 2/043
See application file for complete search history.

(56) References Cited

U.S. PATENT DOCUMENTS

| | | | |
|---|---|---|---|
| 10,665,771 | B2 | 5/2020 | Riihiaho |
| 10,942,580 | B2 | 3/2021 | Zhang |
| 2006/0241864 | A1 | 10/2006 | Rosenberg |
| 2010/0096949 | A1 | 4/2010 | Xu et al. |
| 2012/0075210 | A1 | 3/2012 | Coni et al. |
| 2015/0122621 | A1 | 5/2015 | Fukumoto |
| 2016/0313795 | A1 | 10/2016 | Muramatsu |
| 2017/0083094 | A1 | 3/2017 | Hajati et al. |
| 2019/0067552 | A1* | 2/2019 | Rinner ................... H10N 30/88 |
| 2019/0074424 | A1 | 3/2019 | Nakao |
| 2019/0196597 | A1 | 6/2019 | Rinner et al. |

FOREIGN PATENT DOCUMENTS

| | | |
|---|---|---|
| CN | 102473055 A | 5/2012 |
| CN | 105912163 A | 8/2016 |
| DE | 102015009942 A1 | 2/2017 |
| DE | 102015117262 A1 | 4/2017 |
| DE | 102016116763 A1 | 3/2018 |
| EP | 2461234 A1 | 6/2012 |
| EP | 2461233 B1 | 4/2014 |
| EP | 3232299 A2 | 10/2017 |
| FR | 2740276 A1 | 4/1997 |
| FR | 3000301 A1 | 6/2014 |
| JP | 2011206634 A | 10/2011 |
| JP | 2017174220 A | 9/2017 |
| WO | 2007123404 A1 | 11/2007 |
| WO | 2013186845 A1 | 12/2013 |
| WO | 2014096565 A1 | 6/2014 |
| WO | 2014164018 A1 | 10/2014 |
| WO | 2015092966 A1 | 6/2015 |
| WO | 2016075131 A1 | 5/2016 |

* cited by examiner

DEVICE AND METHOD FOR PRODUCING ACTIVE HAPTIC FEEDBACK

This patent application is a national phase filing under section 371 of PCT/EP2019/052786, filed Feb. 5, 2019, which claims the priority of German patent application 102018102630.7, filed Feb. 6, 2018, each of which is incorporated herein by reference in its entirety.

TECHNICAL FIELD

The present invention relates to a device for producing active haptic feedback and to a method for producing active haptic feedback.

BACKGROUND

Mechanical keys and switches for the operation of devices are increasingly being replaced by purely electronic variants, for example touchscreens. In the employment of a conventional mechanical switch, a jump in force associated with the surmounting of a switching point indicates that the key has been successfully pressed.

FIG. 1 shows a force-displacement diagram for a mechanical key. The displacement executed by the compression of a mechanical key is plotted in this case on the x-axis. The force applied to the key is plotted on the y-axis.

Initially, a key is pressed with virtually no expenditure of a force. The mechanical key can be pretensioned by means of a spring. Only once the spring load has to be surmounted does the force to be applied increase. Firstly, a no-load stroke is executed, during which the force remains constant, where after the force increases in a linear manner. If the switching point SP is achieved, the force declines in the form of a jump in force. In FIG. 1, the switching point SP is identified by the reference symbol SP.

The jump in force is perceived by the user and indicates a successful actuation of the key to the user. Once the switching point SP has been surmounted and the jump in force has occurred, the force to be applied again increases. Shortly before a mechanical limit stop of the key is reached, the force to be applied shows an increasingly strong rise.

The jump in force which occurs upon the surmounting of the switching point is critical to the actuation experience. The user detects the decline in the mechanical resistance of the key and detects that the key has been successfully actuated. Even in a very noisy environment, in which acoustic feedback would not be perceptible, this haptic impression reliably confirms to the user that the key has been pressed.

In purely electronic man-machine interfaces, there is no haptic feedback in the form of the jump in force. Consequently, in order to detect that an interface of this type has been correctly operated, it is frequently necessary for the user to view a display in an active manner. The user can be distracted as a result. For example, touchscreens are increasingly also employed in vehicles. These might constitute an impairment of safety, if the user is compelled to look at the screen. In order to overcome this disadvantage, it is customary for touchscreens to be provided with a haptic feedback facility.

Examples of devices for producing haptic feedback are known from European Patent No. EP 2461233 B1 and International Application No. WO 2016/075131 A1. In these devices, however, the achievable displacements are very limited. As a result of the very small achievable displacements, the latter are only clearly perceptible within a narrow frequency band between approximately 150 Hz and 250 Hz, as this is the band in which the human sense of touch is most sensitive.

SUMMARY

Embodiments provide an improved device and an improved method for producing haptic feedback, wherein, for example, the disadvantages of the above-mentioned devices are overcome.

A device is proposed which comprises at least one piezoelectric actuator, a first amplification element, a second amplification element and a driver circuit. The piezoelectric actuator comprises a plurality of piezoelectric layers and internal electrodes arranged therebetween. The piezoelectric actuator is arranged between the amplification elements, wherein the piezoelectric actuator is designed and configured to change its extension in a first direction upon the application of an electrical voltage, and wherein the amplification elements are designed and configured to deform as a result of the change in the extension of the piezoelectric actuator, such that a portion of the respective amplification element is moved relative to the piezoelectric actuator in a second direction, which is perpendicular to the first direction. The driver circuit is configured to apply an electrical voltage to the piezoelectric actuator, such that the amplification elements are deformed in such a manner that haptic feedback is produced against an object pressing on the device, said feedback imitating a jump in force.

In comparison with other means for producing haptic feedback, for example unbalance motors or linear resonators, the piezoelectric actuator provides the advantage of a significantly shorter response time. A short response time can ensure that, between an actuation of a key and the start of the haptic feedback, an excessive amount of time does not elapse, consequently not resulting in an annoyance to the user. Only a short response time permits the haptic behavior of a mechanical key to be modeled as closely as possible, and the user can experience the feeling which matches their intuitive expectations. The actuation experience for the user can generally be improved as a result.

The employment of the two amplification elements permits the amplitude of the movement, which is critical to the production of the haptic feedback, to be substantially increased. The amplification elements can be configured such that a movement of the piezoelectric actuator in a first direction is translated into a movement in a second direction, the amplitude of which is greater by a factor of at least 5, preferably by a factor of at least 10, than the movement in the first direction. The amplification elements can thus ensure that the haptic feedback is significantly stronger than would be the case, were the change in length of the piezoelectric actuator itself to be employed for producing the haptic feedback. It can thus be ensured that the displacements achieved, even in a hectic situation, can be reliably perceived by the user. It can thus be ensured that haptic feedback is delivered which substantially exceeds the detection threshold perceptible by the user.

Moreover, by the use of the amplification elements, the haptic feedback can also be sufficiently strong for the employment thereof in heavy-duty man-machine interfaces, such as large screens. Without the use of the amplification elements, it would not be possible to move heavy-duty man-machine interfaces of this type to a sufficiently great degree.

The change in the extension of the piezoelectric actuator in the first direction can particularly involve a change in length in a direction perpendicular to a stacking direction, wherein the piezoelectric layers and the internal electrodes are arranged one on top of another in the stacking direction. The change in the extension of the piezoelectric actuator in the first direction can thus be a lateral contraction of the actuator. The change in the extension of the piezoelectric actuator in the first direction can occur in response to the piezoelectric effect, which is generated in the piezoelectric layers by the voltage which is applied between the first and second internal electrodes.

The second direction, in which the subregions of the amplification elements move, can be the stacking direction of the piezoelectric actuator.

The haptic feedback is configured such that a jump in force is imitated. In particular, for a user who presses on the man-machine interface, the impression of a jump in force can be generated. The user can press in this case on the interface with their finger, or using an object such as a stylus. The impression of a jump in force can be produced by a very short vibration, which conveys the feeling to the user of a short-term reduction in mechanical resistance, as is customary upon the surmounting of the switching point SP of a mechanical key. A vibration can be understood here to mean a short-term vibration, which is perceived by the user as a singular event.

The driver circuit can be designed to apply an electrical voltage to the piezoelectric actuator which has the form of a single sine pulse, a single square-wave pulse, a single saw-tooth pulse, a single half-sine pulse, a single half-square-wave pulse or a single half-saw-tooth pulse. Alternatively, the driver circuit can be designed to apply an electrical voltage to the piezoelectric actuator which has the form of a plurality of sine pulses, a plurality of square-wave pulses, a plurality of saw-tooth pulses, a plurality of half-sine pulses, a plurality of half-square-wave pulses or a plurality of half saw-tooth pulses. The plurality of pulses can be perceived herein by the user as a singular event. The plurality of pulses can, for example, be two pulses in each case. By the employment of a plurality of pulses, the feedback can be amplified in comparison with a pulse.

In all these forms, the voltage applied can be significantly varied within a short time. In the case of the saw-tooth and square-wave pulses, the significant variation can be abrupt. In the case of the sine or half-sine pulses, the significant variation is achieved by a sufficiently steep pulse edge. By means of a significant variation in the voltage applied, vibration of the actuator can be initiated, which results in a vibration of the subregions of the amplification elements. As described above, a short vibration is perceived by a user as a jump in force and, in this manner, communicates the impression of the surmounting of a switching point.

Moreover, the voltage applied might also have any other form, provided that the voltage is varied by a sufficiently large magnitude within a sufficiently short time.

According to one exemplary embodiment, the driver circuit is designed to apply the electrical voltage to the piezoelectric actuator in the form of a voltage pulse or a plurality of voltage pulses, when a force is exerted on the device and the force exerted on the device exceeds a force threshold. In particular, the voltage pulse can be square-wave or sinusoidal. By means of the voltage pulse, a vibration of the piezoelectric actuator is initiated, which is perceived by the user as a jump in force.

According to a further exemplary embodiment, the driver circuit can be designed to abruptly increase an electrical voltage applied to the piezoelectric actuator, when a force is exerted on the device and the force exerted on the device exceeds a force threshold. By the prior definition of the force threshold, the force applied which corresponds to the modelled switching point can be determined.

The driver circuit can further be designed to maintain the electrical voltage applied to the piezoelectric actuator constant, until the force exerted on the device undershoots the force threshold. Upon the undershoot of the force threshold, the voltage can be reduced in an abrupt manner. It can thus be permitted that, in each case, the piezoelectric actuator vibrates upon both the overshoot and the undershoot of the force threshold and, correspondingly, haptic feedback is generated twice. The sensation of a jump in force is herein communicated to the user upon both the actuation and the release of the key.

The device can be configured to detect a force exerted on the device. To this end, for example, a separate pressure sensor can be employed, which is arranged on the man-machine interface and measures a pressure exerted on the man-machine interface.

If the device detects that the force applied thereto exceeds the predefined force threshold, the haptic feedback can be produced. To this end, an electrical voltage can then be applied to the piezoelectric actuator.

In one exemplary embodiment, the device is designed to detect a voltage which is generated between the internal electrodes of the piezoelectric actuator and which is produced as a result of a force exerted on the device. The device can further be configured, by reference to the magnitude of the voltage generated between the internal electrodes, to detect the force exerted on the device. In this case, the pressure sensor can be omitted. A compact design, incorporating fewer components, is produced as a result.

The internal electrodes can correspondingly perform a dual function in the device. Firstly, they can serve to detect a force exerted on the man-machine interface on the grounds that, in this case, a voltage is generated between them and, secondly, they can initiate the change in length of the actuator, by means of which change the active haptic feedback is produced, when an electrical voltage is applied between them.

The device can be configured to produce the active haptic feedback, in that an electrical voltage is applied between the internal electrodes of the piezoelectric actuator which voltage results in a change in length of the actuator. The device can be configured to produce the haptic feedback which imitates the jump in force, by abruptly varying the voltage applied to the piezoelectric actuator, as a result of which a vibration is initiated in the piezoelectric actuator.

A frequency of the vibration of the piezoelectric actuator, and thus of a vibration of the subregions of the amplification elements, can lie in a wide range of 10 Hz to 500 Hz. Since, on account of the employment of the amplification elements, strong haptic feedback can be produced, which further exceeds the detection threshold of a user, the feedback is not limited to the frequency range of 150 Hz to 200 Hz, in which the Pacinian corpuscles, and thus the human sense of touch, is most sensitive. Instead, haptic feedback can also be produced at lower frequencies, in a range of 10 Hz to 200 Hz, or at higher frequencies, in a range of 250 Hz to 500 Hz, which can be reliably perceived by a user. As a result of a large amplitude of the movement of the subregions of the amplification elements in the second direction, it can be ensured that the user then reliably perceives the haptic feedback, even when the frequency thereof should lie outside the range of 150 Hz to 200 Hz.

The first amplification element can comprise a truncated cone-shaped plate. The second amplification element can comprise a truncated cone-shaped plate.

The amplification elements can be respectively configured to transform a change in length of the actuator in the first direction into a change in length in the second direction. The amplification elements can respectively serve for the amplification of a change in length of the actuator, which occurs as a result of a lateral contraction of the actuator. To this end, the amplification elements can be respectively shaped such that, as the edge regions of the amplification elements move together or move apart, a substantial rise or fall of a central region of the amplification elements occurs. The amplification elements can each concomitantly contribute to the conversion of the lateral contraction of the base component into a substantial change in length in the stacking direction of the actuator.

The truncated cone-shaped plate can comprise an edge region which is fastened to the upper side or the underside of the actuator. The edge region can be fastened to the actuator, for example, by means of adhesive bonding, soldering or welding. The plate can further comprise a central region which protrudes from the upper side or the underside of the actuator in the stacking direction. The spacing of the central region of the plate from the upper side or the underside can vary substantially, when the actuator undergoes lateral contraction as a result of a voltage applied between the internal electrodes.

The plate can comprise titanium or can consist of titanium. Titanium provides significant advantages, particularly in the present application for producing active haptic feedback. Upon the actuation of the device by a person, moisture, for example in the form of finger-tip perspiration, can be transferred to the plate. This can result in corrosion. However, titanium is a particularly corrosion-resistant material, such that it can effectively protect the device against long-term damage by corrosion.

Titanium further has a high mechanical load-bearing capability, such that it can extend the service life of the component.

Titanium moreover has a coefficient of thermal expansion which is very close to the coefficient of thermal expansion of the actuator. As a result, the connection point of the plate to the actuator is not subject to any significant mechanical loading associated with a change in the temperature.

The mechanical amplification element can be a metal bracket. An amplification element of this type can be employed in combination with a cuboid piezoelectric actuator, the length of which is greater than its width. An elongated actuator of this type and the associated bracket-shaped amplification element, in comparison with an actuator having a quadratic base surface and a truncated cone-shaped amplification element, permit improved miniaturization and, additionally, greater forces can be generated with the same input voltage.

The mechanical amplification element can be free of indentations and can have a constant wall thickness. Alternatively, the mechanical amplification element can comprise at least one indentation, which reduces a mechanical resistance to deformation of the mechanical amplification element. The indentations can ensure that it is possible to deform the amplification element with a small force. However, it may be advantageous to omit indentations, if amplification elements are constructed with a small thickness, as these might otherwise be excessively unstable.

The piezoelectric actuator can comprise a quadratic base surface. Alternatively, the piezoelectric actuator can comprise a base surface, the length of which is greater than its width. The base surface can be a surface here, the surface normal of which is oriented in a stacking direction, in which electrodes and piezoelectric material are stacked. The length can describe the extension of the longest side of the base surface. The width can describe the extension of the shortest side of the base surface.

The device can comprise a base plate and a man-machine interface, which is configured to be actuated by the object, wherein the piezoelectric actuator is arranged between the base plate and the man-machine interface. In particular, the haptic feedback can be produced, in that the movement of the subregions of the amplification elements relative to one another is transformed into a movement of the man-machine interface relative to the base plate.

Further embodiments refer to a method for producing active haptic feedback by means of the above-mentioned device. By means of the driver circuit, an electrical voltage applied to the piezoelectric actuator is varied herein, when a force acting on the device exceeds a force threshold.

BRIEF DESCRIPTION OF THE DRAWINGS

The present invention is further described hereinafter with reference to the figures.

DETAILED DESCRIPTION OF ILLUSTRATIVE EMBODIMENTS

Figure 2:
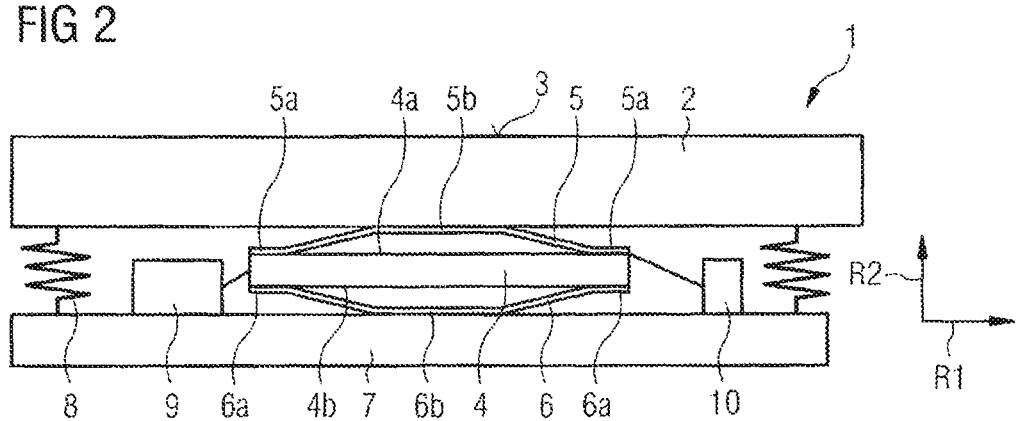
FIG. 2 shows a device 1 for producing active haptic feedback.

FIG. 2 shows a device 1 for producing active haptic feedback. The active haptic feedback is configured herein to generate the sensation, in a user who applies pressure to the device 1, of the compression of a mechanical key. To this end, the device 1 is configured such that the haptic feedback produced imitates a jump in force.

The device 1 comprises a man-machine interface 2. This is an actuating element, which can be actuated by a user of the device 1. For example, the man-machine interface 2 can be a touchscreen, as is customary, for example, in mobile telephones or other terminal devices. The user can actuate the man-machine interface 2 by the application of pressure with a finger or an object, for example a stylus, on an operator interface 3 of the man-machine interface 2.

The device 1 further comprises a piezoelectric actuator 4. The piezoelectric actuator 4 is a multi-layer component, which comprises alternately arranged layers of piezoelectric material and internal electrodes. The piezoelectric actuator 4 is configured to deform in response to an applied electrical voltage. In particular, the piezoelectric actuator 4 is configured to change its length in a first direction R1, when a voltage applied to the piezoelectric actuator 4 is varied.

The device 1 further comprises a first amplification element 5 and a second amplification element 6. The first amplification element 5 is arranged on an upper side 4a of the piezoelectric actuator 4, which faces the man-machine interface 2. The second amplification element 6 is arranged on an underside 4b of the piezoelectric actuator 4, which is averted from the man-machine interface 2.

Each of the amplification elements 5, 6 is a truncated cone-shaped plate, wherein edge regions 5a, 6a of the plate are fastened to the upper side 4a or the underside 4b of the piezoelectric actuator 4, and a central region 5b, 6b of the respective plate is spaced apart from the piezoelectric actuator 4. The amplification elements 5, 6 are configured to convert a change in length of the piezoelectric actuator 4 in a first direction R1 into a movement in a second direction R2, which is perpendicular to the first direction. The amplification elements are further configured herein such that an amplitude of the movement in the second direction is greater than an amplitude of the movement in the first direction.

The device further comprises a base plate 7. The central region 5b of the first amplification element 5 is fastened to the man-machine interface 2. The central region 6b of the second amplification element 6 is fastened to the base plate 7. If the central regions 5b, 6b of the amplification elements 5, 6 are then moved relative to one another in the second direction R2, this movement is translated into a movement of the man-machine interface 2 relative to the base plate 7. The base plate 7 is a multiple of times heavier than the man-machine interface 2, such that the base plate 7 essentially remains unmoved. If the man-machine interface 2 is moved relative to the base plate 7, haptic feedback is generated for a user who applies pressure to the man-machine interface 2.

The amplitude of the movement of the man-machine interface 2 is dictated herein by the amplitude of the movement of the two amplification elements 5, 6 in the second direction R2. This movement has a greater amplitude than the change in length of the piezoelectric actuator 4 in the first direction R1. As a result, the haptic feedback generated is significantly stronger than would be the case, were the movement of the piezoelectric actuator 4 itself to be employed for the generation of the haptic feedback. On the grounds of the large amplitude of the movement which, in this case, is responsible for the haptic feedback, the feedback can be reliably perceived by a user even in hectic situations. Moreover, it is also possible for a heavy-duty man-machine interface 2, for example a large screen, to be employed. As a result of the strong haptic feedback, this configuration of the device 1 further permits the employment of a very broad frequency spectrum for the production of the haptic feedback.

The device further comprises at least two springs 8. The two springs 8 are arranged between the man-machine interface 2 and the base plate 7, and are herein compressed, and thus tensioned, between the man-machine interface 2 and the base plate 7. By means of the springs 8, the man-machine interface 2 is suspended in a sprung arrangement in a position parallel to the base plate 7. The springs 8 herein prevent a tilting movement of the man-machine interface 2 relative to the base plate 8. The springs 8 simultaneously provide a sufficient freedom of movement, such that the man-machine interface 2, in the event of movements of the piezoelectric actuator 4 relative to the base plate 7, can be moved in the second direction R2. The amplitude of such a movement is customarily smaller than 1 mm, preferably smaller than 500 µm.

The device 1 further comprises a measuring unit 9. The measuring unit is illustrated schematically in FIG. 2. The measuring unit 9 is connected to at least two internal electrodes of the piezoelectric actuator 4, and can detect when an electrical voltage between the internal electrodes is generated. If a user applies pressure to the man-machine interface 2, this force is exerted on the piezoelectric actuator 4 via the man-machine interface 2 and the first amplification element 5. An electrical voltage is thus generated in the piezoelectric actuator 4, which voltage is recorded by the measuring unit 9. From said electrical voltage recorded, the measuring unit 9 can then infer the force which is exerted on the device 1.

In an alternative exemplary embodiment (not shown), the device 1 can comprise a separate force sensor, which detects a force which is exerted on the man-machine interface 2. In this case, the voltage which is generated in the actuator 4 is not employed for the measurement of the force.

The device 1 further comprises a driver circuit 10, which is configured to apply an electrical voltage to the actuator 4 in order to produce the active haptic feedback. Hereinafter, various voltages which can be applied to the actuator 4 are considered, each of which permits the production of active haptic feedback which creates the impression of a jump in force.

If the electrical voltage is applied to the actuator 4, the length of the actuator 4 changes in the first direction R1 and, by means of the amplification elements 5, 6, this change in length is translated into a movement of greater amplitude in the second direction R2. The central regions 5b, 6b of the two amplification elements 5, 6 are herein either moved away from one another or moved toward one another. By the application of the electrical voltage to the piezoelectric actuator 4, a brief vibration of the actuator is generated, which is perceived in the form of haptic feedback by a user who applies pressure to the man-machine interface 2.

Haptic feedback is always produced whenever the voltage applied to the piezoelectric actuator 4 is varied significantly within a short time, for example within a time interval of less than 10 ms. By varying the voltage applied to the piezoelectric actuator 4, a vibration is initiated in the latter, since its length changes. This occurs both in the event of a rapid increase in the voltage applied and in the event of a rapid decrease in the voltage applied.

Figure 3:
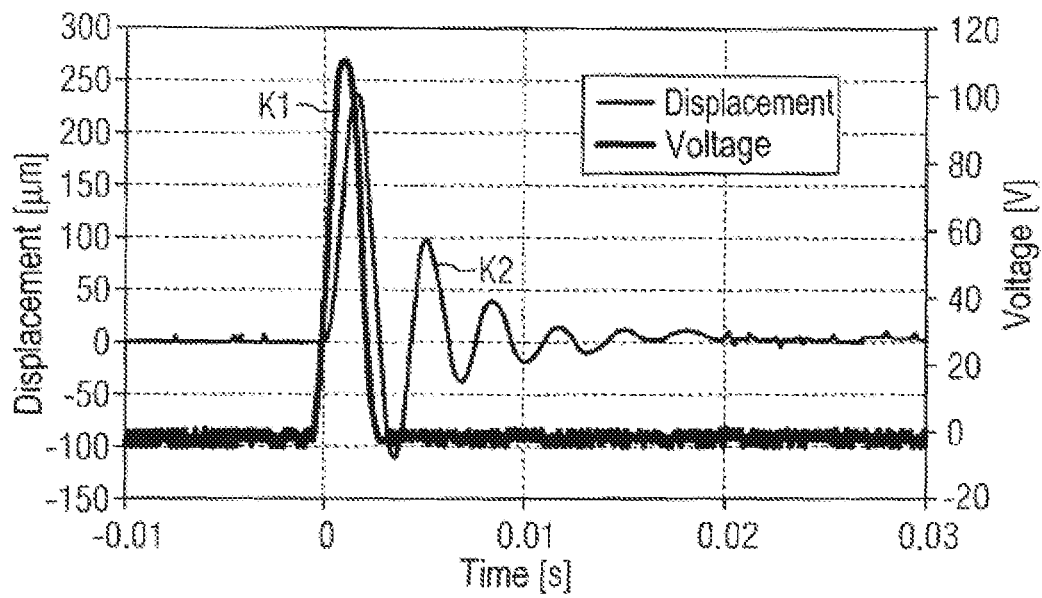
FIG. 3 shows the behavior of the piezoelectric actuator resulting from the application of a single half-sine pulse.

FIG. 3 shows the behavior of the piezoelectric actuator 4 resulting from the application of a single half-sine pulse.

The curve K1 represents here the characteristic of the voltage applied by the driver circuit 10 to the piezoelectric actuator 4. The voltage features a single half-sine pulse, which has a pulse width of 3.3 ms, that is to say a frequency of approximately 300 Hz. In FIG. 3, the time in seconds is plotted on the x-axis. The magnitude of the voltage applied, with respect to the curve K1, is plotted in V on the y-axis.

The curve K2 represents the displacement characteristic of the amplification elements 5, 6 in response to the voltage applied to the actuator 4. In FIG. 3, the time in seconds is plotted on the x-axis. The displacement of the amplification elements 5, 6, which are fastened to the piezoelectric actuator 4, in the second direction R2, with respect to the curve K1, is plotted in µm on the y-axis.

It can be seen that a maximum displacement of approximately 250 µm is achieved after approximately 5 ms. Accordingly, the device 1 has a very short response time.

The short response time of less than 10 ms results from the use of the piezoelectric actuator 4 to produce the haptic feedback.

Once the voltage applied has dropped to 0 V, the piezoelectric actuator 4 has a decaying behavior. The amplitude of its change in length, and thus also the amplitude of the movement of the amplification elements 5, 6, decline in a continuous manner. After approximately 0.02 s, the vibration of the actuator 4 has decayed completely.

Overall, the piezoelectric actuator 4 executes a brief vibration in response to the voltage pulse applied. The amplitude of the brief vibration declines in a continuous manner. The vibration executed by the actuator 4 is perceived as haptic feedback by a user who applies pressure to the man-machine interface 2. In particular, it thus appears to the user who applies pressure to the operator interface 3 of the man-machine interface 2 as if a mechanical resistance of the man-machine interface 2 would have undergone a short-term reduction. The user thus receives the impression of a jump in force.

Figure 4:
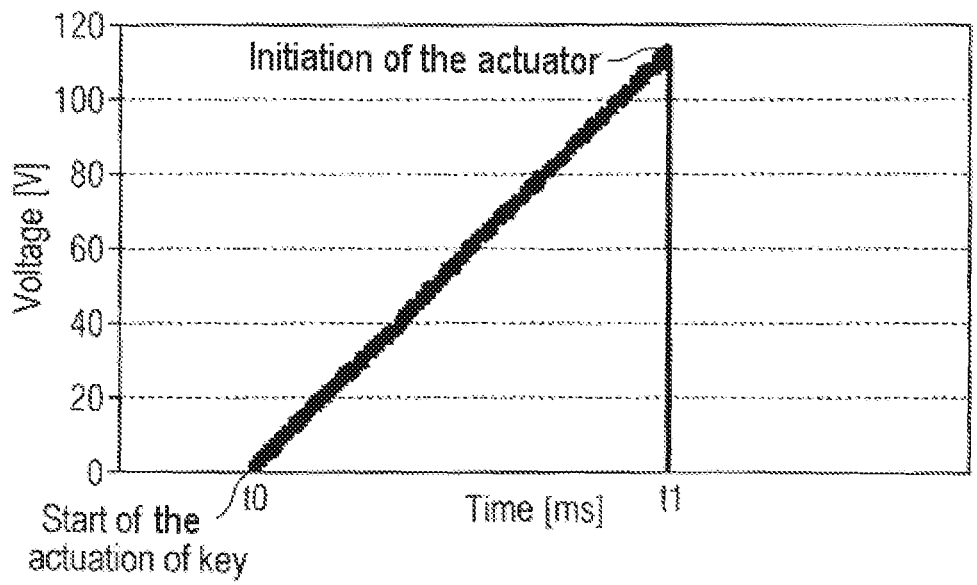
FIG. 4 shows a saw-tooth pulse, which can be applied to an actuator as electrical voltage.

FIG. 4 shows a saw-tooth pulse which can be applied to the actuator 4 as electrical voltage. The time in seconds is plotted herein on the x-axis, and the voltage applied at the respective time point, in volts, is plotted on the y-axis. At the time point to, actuation of the man-machine interface 2 is detected. For example, the measuring unit 9 can detect that a force is exerted on the man-machine interface 2. In the example represented here, the force at the time point to is lower than a predefined force threshold. An electrical voltage is now applied to the actuator 4 by the driver circuit 10.

In the example represented here, the force exerted by a user on the man-machine interface 2 is slowly increased until, at the time point to, it exceeds the predefined force threshold. The voltage applied by the driver circuit 10 to the actuator 4 is increased continuously between the time points $t_0$ and $t_1$. The length of the piezoelectric actuator 4 herein changes at a low rate. Correspondingly, the actuator 4 is excited only to very slight vibrations.

At the time point $t_1$, the force exerted on the actuator 4 exceeds the predefined force threshold. The measuring unit 9 monitors the force exerted on the man-machine interface 2. At the time point $t_1$, the voltage applied by the driver circuit 10 is abruptly set to zero. As a result, in a similar manner to the brief half-sine pulse represented in FIG. 3, a significant change in length of the piezoelectric actuator 4, and thus, by association, a clearly pronounced movement of the amplification elements 5, 6, is initiated, as a result of which haptic feedback is produced for a user who applies pressure to the man-machine interface 2.

Figure 5:
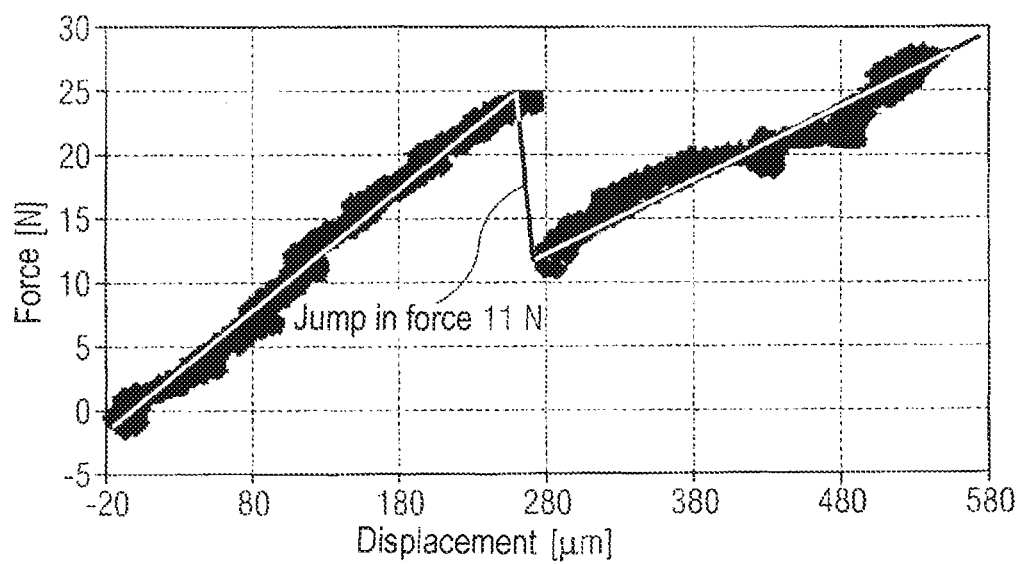
FIG. 5 shows a force-displacement diagram, which indicates how the user perceives the actuation of a man-machine interface.

In FIG. 5, a force-displacement diagram is represented, which shows how the user perceives the actuation of the man-machine interface 2. The force exerted on the man-machine interface by the user, according to their own sensation, is plotted herein on the y-axis. The displacement about which the interface is moved according to the sensation of the user is plotted on the x-axis.

Figure 1:
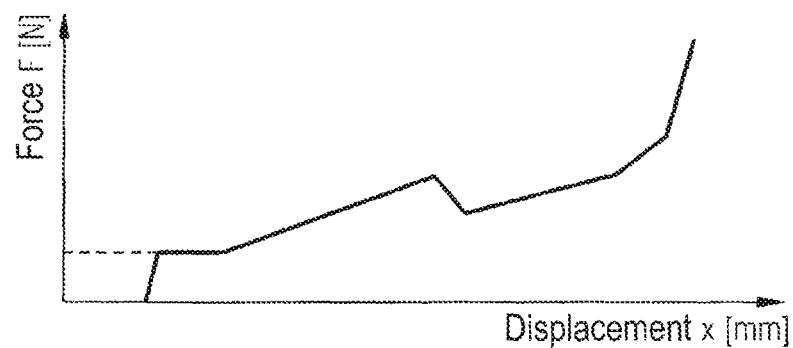
FIG. 1 shows a force-displacement diagram for a mechanical key.

In this case, the predefined force threshold is 25 N. If the force threshold is achieved, a short-term vibration is initiated in the actuator 4. This vibration is perceived by the user as a jump in force. It thus appears to the user as if the force exerted by the latter on the man-machine interface 2 is reduced. If the user then continues to apply pressure to the man-machine interface 2, the force exerted appears to rise again. The force-displacement diagram shown in FIG. 5 very closely resembles the force-displacement diagram which is generated by the actuation of a mechanical key and which can be represented in FIG. 1. The jump in force can clearly signal to the user that the man-machine interface 2 has been actuated. The haptic behavior of a mechanical key can thus be accurately modeled by the device 1. The user experiences the feeling which they anticipate by intuition. Any irritation of the user is thus prevented, and the operating experience is generally enhanced.

In an alternative embodiment, upon the achievement of the force threshold, a square-wave voltage can be applied to the actuator 4. The voltage is herein increased abruptly, such that haptic feedback is produced for the user. The voltage applied remains applied in a continuous manner, until the measuring unit 9 detects that the force exerted on the man-machine interface 2 undershoots the force threshold. The voltage is then reduced abruptly, as a result of which a further vibration of the actuator 4 and, by association, further haptic feedback occurs. The user thus receives the sensation of the release of a mechanical key. Again, a jump in force is modeled by the haptic feedback.

The driver circuit 10 can be configured to apply an electrical voltage with any desired characteristic to the piezoelectric actuator 4. For the production of haptic feedback, it is essential that the voltage applied changes substantially within a short time interval. For example, the voltage applied can have the form of a single sine pulse, a single square-wave pulse, a single saw-tooth pulse, a single half-sine pulse, a single half-square-wave pulse or a single half-saw-tooth pulse.

The device 1 described herein thus permits the advantages of a purely mechanical key to be combined with the advantages of purely electronic man-machine interfaces, for example touchscreens. A key advantage of the purely mechanical key is the jump in force which occurs upon the actuation of the key and communicates reliable feedback of a successful actuation to the user. The advantages of purely electronic man-machine interfaces are, for example, that they are more cost-effective and more versatile. Moreover, low-maintenance, optically attractive operator interfaces can be implemented. The present device permits the disadvantage of purely electronic man-machine interfaces to be overcome, that a user of the latter cannot detect, without further action, whether or not they have successfully actuated a specific key.

Figure 6:
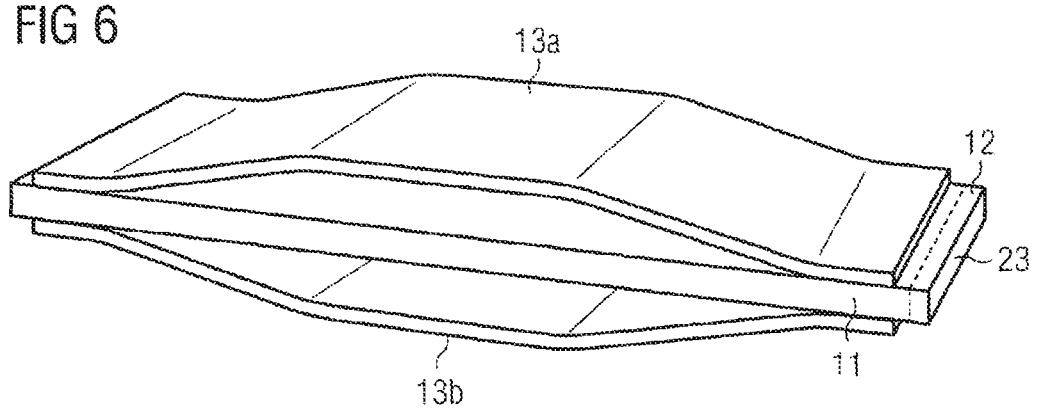
FIG. 6 shows a piezoelectric actuator and associated amplification elements in a perspective view.
Figure 7:
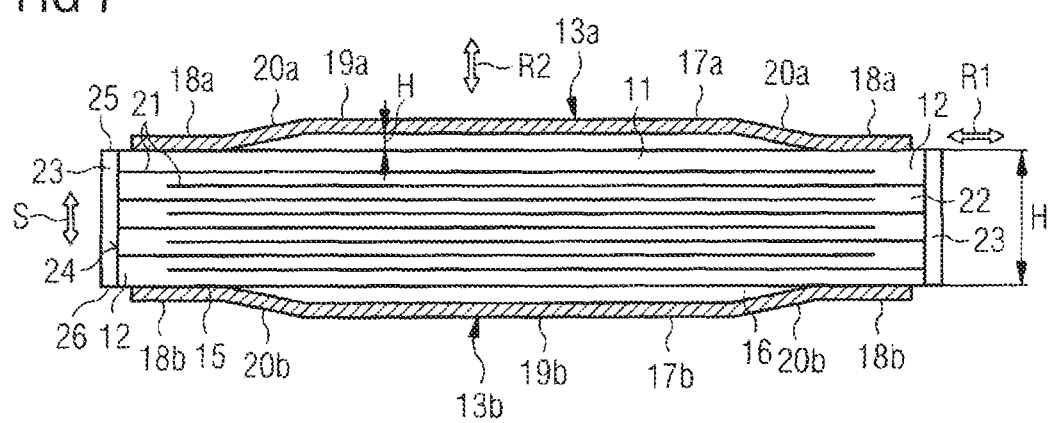
FIG. 7 shows a side view of the piezoelectric actuator and the associated amplification elements.

FIGS. 6 and 7 show an alternative piezoelectric actuator 11 having two amplification elements 13a, 13b, which can be employed in place of the actuator 4 shown in FIG. 2, having the two amplification elements 5, 6 shown in FIG. 2.

The piezoelectric actuator 4 shown in FIG. 2 has a quadratic base surface. The associated amplification elements 5, 6 are truncated cone-shaped.

Conversely, the piezoelectric actuator 11 shown in FIGS. 6 and 7 has a rectangular base surface. Its length L is herein greater than its width B, wherein the length L describes the longer side of the rectangular base surface and the width B describes the shorter side of the rectangular base surface. For example, the ratio of the length L to the width B can range from 2:1 to 20:1. The amplification elements 13a, 13b are metal brackets. The amplification elements 13a, 13b can comprise titanium or can consist of titanium.

The piezoelectric actuator 11 shown in FIG. 6 and FIG. 7 permits higher forces and higher accelerations to be generated than the piezoelectric actuator 4 shown in FIG. 2. The piezoelectric actuator 11 and the associated amplification elements 13a, 13b are described in detail hereinafter.

Figure 8:
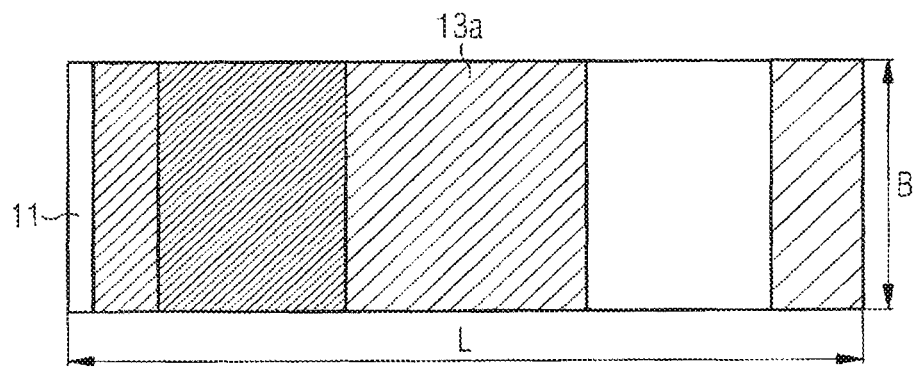
FIG. 8 shows an overhead view of an upper side of the actuator.

FIG. 6 shows the piezoelectric actuator 11 and the associated amplification elements 13a, 13b in a perspective view. FIG. 7 shows a side view of the piezoelectric actuator 11 and of the associated amplification elements 13a, 13b. FIG. 8 further shows an overhead view of the upper side of the amplification element 13a and of the actuator 11.

The piezoelectric actuator 11 comprises a stack of internal electrodes 21 and piezoelectric layers 22 which are stacked alternately one on top of another in a stacking direction S. The piezoelectric actuator 11 comprises a first external electrode 23, which is arranged on a first end face 24, and a second external electrode 23, which is arranged on a second end face. The internal electrodes 21 are alternately contact-connected with the first external electrode 23 or with the second external electrode 23 in the stacking direction S.

The piezoelectric layers 22 can be lead zirconate titanate ceramics (PZT ceramics). Further, the PZT ceramic can additionally contain Nd and Ni. Alternatively, the PZT ceramic can additionally further comprise Nd, K and optionally Cu. Alternatively, the piezoelectric layers 22 can comprise a $Pb(Zr_xTi_{1-x})O_3+yPb(Mn_{1/3}Nb_{2/3})O_3$-containing compound.

The internal electrodes 21 comprise copper or consist of copper.

The piezoelectric actuator 11 is cuboid. A base surface describes in this case a surface, the surface normal of which is oriented in the stacking direction S. The base surface is rectangular. The longer side of the base surface defines the length L of the piezoelectric actuator 11, and the shorter side of the base surface defines the width B of the piezoelectric actuator 11.

The piezoelectric actuator 11 has a length L between 5 mm and 20 mm and a width B between 2 mm and 8 mm. According to a first exemplary embodiment, the piezoelectric actuator 11 has a length L of 12 mm and a width B of 4 mm. In a second exemplary embodiment, the piezoelectric actuator 11 has a length L of 9 mm and a width B of 3.75 mm.

The extension of the piezoelectric actuator in the stacking direction S defines the height H of the piezoelectric actuator 11. The height H of the piezoelectric actuator 11 can lie between 200 μm and 1000 μm. For example, the height H in the first and second exemplary embodiments is 500 μm respectively.

The actuator 11 comprises two insulating regions 12. The respective insulating region 12 is configured in an end region of the actuator 11. In particular, the respective insulating region 12 is configured in the region of an end face 24 of the actuator.

In the insulating region 12, only internal electrodes 21 of one polarity extend to the end face 24 of the actuator 11. The insulating region 12 can be employed for the contact-connection of the actuator 11. For example, the respective insulating region 12, with the external electrodes 23, can be provided for electrical contact-connection.

The actuator 11 is configured such that, upon the application of an electrical voltage, deformation of the actuator 11 occurs (extension in a first direction R1). In particular, the piezoelectric layers 22 are polarized such that the application of an electrical voltage between the internal electrodes 21 results in a lateral contraction of the actuator 11, wherein the length L of the actuator 11 changes perpendicularly to the stacking direction S. An extension of the actuator thus occurs transversely to the polarization direction and to the electric field (d31 effect).

In order to further amplify the effect of the change in length in the stacking direction S, the device comprises the two amplification elements 13a, 13b. When a voltage is applied to the actuator 11, the amplification elements 13a, 13b at least partially undergo deformation in response to the change in the extension of the actuator 11, as described in detail below. In particular, the two amplification elements 13a, 13b are dimensioned and connected to the actuator 11 such that a subregion 17a, 17b of each of the amplification elements 13a, 13b, in response to a change in the length L of the actuator, executes a lifting motion in the stacking direction S, wherein the amplitude of the lifting motion is greater than the amplitude of the change in the length L of the actuator.

The actuator 11 is arranged between the amplification elements 13a, 13b. The amplification elements 13a, 13b at least partially rest on the upper side 25 or an underside 26 of the actuator 11.

The respective amplification element 13a, 13b is configured in one piece. The respective amplification element 13a, 13b, is rectangular in shape. The respective amplification element 13a, 13b, is configured in a strip shape. The respective amplification element 13a, 13b, is of a curved or bent configuration. The respective amplification element 13a, 13b, is bracket-shaped. The respective amplification element, for example, comprises a sheet metal strip. The respective amplification element comprises titanium or consists of titanium. The sheet metal strip is curved, as described in detail below.

Each of the one-piece amplification elements 13a, 13b is subdivided into a plurality of regions or sections. The respective amplification element 13a, 13b thus comprises a subregion or first region 17a, 17b. The subregion 17a, 17b respectively comprises a first section or central region 19a, 19b.

The subregion 17a, 17b further respectively comprises two second sections or connection regions 20a, 20b. The two connection regions 20a, 20b of the respective amplification element 13a, 13b directly adjoin the central region 19a, 19b of the respective amplification element 13a, 13b. In other words, the central region 19a, 19b of the respective amplification element 13a, 13b is enclosed on both sides by the two connection regions 20a, 20b.

The respective amplification element 13a, 13b further comprises two end regions 18a, 18b. The end regions 18a, 18b directly adjoin the connection regions 20a, 20b of the respective amplification element 13a, 13b. In other words, a connection region 20a, 20b respectively connects an end region 18a, 18b to the central region 19a, 19b of an amplification element 13a, 13b.

The two end regions 18a, 18b of the respective amplification element rest directly on a surface of the actuator 11. The first and the second end region 18a of the first amplification element 13a thus rest on a subregion of the upper side 25 of the actuator 11. Moreover, the first and the second end region 18b of the second amplification element 13b rest on a subregion of the upper side 25 or the underside 26 of the actuator 11.

The end regions 18a, 18b are preferably permanently connected to the surface of the actuator 11. In particular, the end regions 18a, 18b are connected to the surface of the actuator 11 by means of an adhesive bond 15.

The respective subregion 17a, 17b is spaced apart from the surface of the actuator 11. In particular, a free area 16 is located between the respective subregion 17a, 17b and the underside 26 or the upper side 25 of the actuator 11. The free area 16 has a height h. A free height h between the actuator 11 and the subregion 17a, 17b lies between 0.2 mm and 2.0, and is equal to 0.75 mm in the first exemplary embodiment and to 0.4 mm in the second exemplary embodiment, wherein the free height h specifies the maximum clearance between the subregion 17a, 17b and the piezoelectric actuator 11 when no voltage is applied to the actuator 11 and no external force is acting on the amplification element 13a, 13b.

The height h of the free area 16 varies along the respective subregion 17a, 17b. The central region 19a, 19b of the respective subregion 17a, 17b is thus configured such that it runs parallel with the surface of the actuator 11. The height h of the free area 16 is thus at a maximum in the region of the central region 19a, 19b. Conversely, the respective connection region 20a, 20b, runs obliquely to the surface of the actuator 11. In other words, the respective connection region 20a, 20b, encloses an angle with the upper side 25 or the underside 26 of the actuator 11. The angle is preferably less than or equal to 45°. The height h of the free area 16 thus decreases in the direction of the central region 19a, 19b toward the end region 18a, 18b of the respective amplification element 13a, 13b. As a result, the respective amplification element 13a, 13b has a curved shape.

In alternative embodiments (not shown here), the respective amplification element 13a, 13b can comprise at least one thinned area, preferably a plurality of thinned areas, between the respective regions of the amplification element.

The mechanical amplification elements 13a, 13b can respectively be a titanium sheet metal which has a thickness between 0.1 mm and 0.4 mm. For example, the sheet metal can have a thickness of 0.2 mm. At sheet metal thicknesses in the above-mentioned range, deformation of the sheet metal which is required for the execution of a lifting motion can be achieved with a small force. Any increase in the deformability of the sheet metal by the thinned areas can thus be omitted. Correspondingly, the sheet metal can be free of thinned areas or indentations.

The flat central region 19a, 19b of the respective amplification element 13a, 13b can have a length between 1.5 mm and 5.0 mm. In the first exemplary embodiment, the central region 19a, 19b is 3.5 mm long. In the second exemplary embodiment 19a, 19b, the central region is 2.5 mm long. The end regions 18a, 18b can have a length between 1.0 mm and 0.5 mm. In the first and second exemplary embodiments, the end regions 18a, 18b are respectively 0.7 mm long. A shorter length than 0.5 mm should not be selected, as it might not otherwise be possible to configure a sufficiently strong adhesive bond 15 between the end regions 18a, 18b and the actuator 11.

An overall height of the component consisting of the actuator 11 and the two amplification elements 13a, 13b, can lie between 5.0 mm and 1.0 mm. In the first exemplary embodiment, the overall height is 2.4 mm. In the second exemplary embodiment, the overall height is 1.7 mm.

For the employment of the piezoelectric actuator 11 and the amplification elements 13a, 13b in electronic devices, miniaturization is a key factor. By the employment of the components described here and having the dimensions indicated, components are provided which produce a haptic signal and in this case only have a very small space requirement. A component having the above-mentioned dimensions, for example, can be arranged under an operator interface of a mobile telephone or a watch housing.

In the first exemplary embodiment, an applied voltage of 60 V results in a free displacement, or lifting, of 25 μm and a blocking force of 3.5 N. Rigidity is herein 0.14 N/μm. In the second exemplary embodiment, an applied voltage of 60 V results in a free displacement, or lifting, of 15 μm and a blocking force of 2.5 N. Rigidity is herein 0.16 N/μm.

If a voltage is now applied to the actuator 11, the subregions 17a, 17b of the respective amplification element 13a, 13b move relative to the actuator 11 in a second direction R2. The second direction R2 is perpendicular to the first direction R1. The second direction R2 runs along the stacking direction S.

In particular, the central regions 19a, 19b move in the second direction R2. The respective amplification element 13a, 13b in this case bends at transitions between a central region 19a, 19b and connection regions 20a, 20b, and between connection regions 20a, 20b and end regions 18a, 18b.

Conversely, a movement of the end regions 18a, 18b in the second direction R2 is prevented by the adhesive bond 15 with the actuator 11. Instead, the end regions 18a, 18b move with the actuator 11 in the first direction R1. A relative movement thus occurs between the end regions 18a, 18b and the subregions 17a, 17b.

The invention claimed is:

1. A device for producing active haptic feedback comprising:
at least one piezoelectric actuator having a plurality of piezoelectric layers and internal electrodes arranged therebetween;
a first amplification element and a second amplification element, wherein the at least one piezoelectric actuator is arranged between the first and second amplification elements, wherein the at least one piezoelectric actuator is configured to change its extension in a first direction upon application of an electrical voltage, and wherein the first and second amplification elements are configured to deform as a result of the change in the extension of the at least one piezoelectric actuator such that a subregion of a respective amplification element is moved relative to the at least one piezoelectric actuator in a second direction, which is perpendicular to the first direction; and
a driver circuit configured to apply the electrical voltage to the at least one piezoelectric actuator such that the first and second amplification elements are deformed thereby producing the active haptic feedback against an object pressing on the device, the active haptic feedback imitating a jump in force.

2. The device according to claim 1, wherein the driver circuit is configured to apply the electrical voltage to the at least one piezoelectric actuator, and wherein the electrical voltage forms at least one of a single sine pulse, a single square-wave pulse, a single saw-tooth pulse, a single half-sine pulse, a single half-square-wave pulse, a single half-saw-tooth pulse, a plurality of sine pulses, a plurality of square-wave pulses, a plurality of saw-tooth pulses, a plurality of half-sine pulses, a plurality of half-square-wave pulses or a plurality of half-saw-tooth pulses.

3. The device according to claim 1, wherein the driver circuit is configured to apply the electrical voltage to the at least one piezoelectric actuator such that the electrical voltage applied initially increases in a continuous manner, when a force is exerted on the device, and that the electrical voltage applied decreases abruptly, when the force exerted on the device exceeds a force threshold.

4. The device according to claim 1, wherein the driver circuit is configured to apply the electrical voltage to the at least one piezoelectric actuator in form of a voltage pulse or a plurality of voltage pulses, when a force exerted on the device exceeds a force threshold.

5. The device according to claim 1, wherein the driver circuit is configured to: abruptly increase the electrical voltage applied to the at least one piezoelectric actuator when a force exerted on the device exceeds a force threshold, and maintain the electrical voltage constantly applied to the at least one piezoelectric actuator until the force which is exerted on the device undershoots the force threshold.

6. The device according to claim 1, wherein the device is configured to detect a force exerted on the device.

7. The device according to claim 1, wherein the device is configured to: detect the electrical voltage generated between the internal electrodes of the at least one piezoelectric actuator and produced as a result of a force exerted on the device, and detect the force exerted on the device by reference to a magnitude of the electrical voltage generated between the internal electrodes.

8. The device according to claim 1, wherein the device is configured to generate the active haptic feedback, by applying the electrical voltage between the internal electrodes of the at least one piezoelectric actuator thereby changing length of the at least one piezoelectric actuator.

9. The device according to claim 1, wherein the first amplification element is free of indentations and has a constant wall thickness, and wherein the second amplification element is free of indentations and has a constant wall thickness.

10. The device according to claim 1, wherein the first amplification element comprises at least one indentation configured to reduce a mechanical resistance to deformation of the first amplification element, and wherein the second amplification element comprises at least one indentation configured to reduce a mechanical resistance to deformation of the second amplification element.

11. The device according to claim 1, wherein the device is configured to generate the active haptic feedback which imitates the jump in force, by abruptly varying the electrical voltage applied to the at least one piezoelectric actuator, as a result of which a vibration of the at least one piezoelectric actuator is initiated.

12. The device according to claim 11, wherein a frequency of the vibration lies in a range of 10 Hz to 500 Hz.

13. The device according to claim 1, wherein the first amplification element comprises a truncated cone-shaped plate, and wherein the second amplification element comprises a truncated cone-shaped plate.

14. The device according to claim 13, wherein the truncated cone-shaped plates respectively comprise an edge region, which is fastened to an upper side or an underside of the at least one piezoelectric actuator, and a central region, which protrudes from the upper side or the underside and which forms the subregion, which is configured to be moved in the second direction.

15. The device according to claim 13, wherein the truncated cone-shaped plates respectively comprise titanium.

16. The device according to claim 15, wherein each of the first and second amplification elements comprises exactly one metal bracket.

17. The device according to claim 15, wherein the first amplification element comprises a metal bracket, and wherein the second amplification element comprises a metal bracket.

18. The device according to claim 1, wherein the at least one piezoelectric actuator comprises a quadratic base surface, or wherein the at least one piezoelectric actuator comprises a base surface, a length of which is greater than its width.

19. The device according to claim 1, further comprising a base plate and a man-machine interface, which is configured to be actuated by the object, and wherein the at least one piezoelectric actuator is arranged between the base plate and the man-machine interface.

20. A method for operating the device according to claim 1, the method comprising: applying the electrical voltage to the at least one piezoelectric actuator is varied by the driver circuit when a force acting on the device exceeds a force threshold.

* * * * *